United States Patent [19]

Virgili

[11] Patent Number: 4,479,553
[45] Date of Patent: Oct. 30, 1984

[54] PNEUMATICALLY ACTUATED AND CONTROLLED DEVICE FOR CARRYING OUT OPERATIONS ON ELECTRONIC COMPONENTS

[76] Inventor: Tonino Virgili, Via Molino, 8, Montefiore dell'Aso (AP), Italy

[21] Appl. No.: 349,586

[22] Filed: Feb. 17, 1982

[30] Foreign Application Priority Data

Mar. 17, 1981 [IT] Italy .................. 3372 A/81

[51] Int. Cl.³ ............................................. B23B 45/04
[52] U.S. Cl. ..................................... 173/168; 30/180; 30/228; 81/301; 91/304; 91/421
[58] Field of Search .................. 173/168, 18, 19; 294/88; 81/301; 279/108, 35, 36, 37; 30/180, 228; 91/461, 304, 305, 306, 421

[56] References Cited

U.S. PATENT DOCUMENTS

| | | | |
|---|---|---|---|
| 3,350,780 | 11/1967 | Artru et al. | 30/228 |
| 3,372,479 | 3/1968 | Fischer | 30/180 |
| 3,563,273 | 2/1971 | Mills | 91/306 |
| 3,782,246 | 1/1974 | Hilbrands | 91/306 |
| 4,031,619 | 6/1977 | Gregory | 81/301 |
| 4,348,044 | 9/1982 | Wood | 294/88 |

FOREIGN PATENT DOCUMENTS

| | | | |
|---|---|---|---|
| 2100669 | 7/1972 | Fed. Rep. of Germany | 81/301 |
| 722160 | 1/1955 | United Kingdom | 81/301 |
| 1099948 | 1/1968 | United Kingdom | 30/228 |

*Primary Examiner*—Frank T. Yost
*Assistant Examiner*—Hien H. Phan

[57] ABSTRACT

The front end of a handgrip mounts an interchangeable tool-holder for pincer type tools whose opening and closing is controlled pneumatically through a cylinder-piston assembly to which a source of compressed air is supplied. Downstream of the compressed-air source there is a pneumatic circuit for the automatic operation, intermittently at adjustable intervals, of the cylinder-piston assembly. The placing in service and the taking out of service of the pneumatic circuit is controlled by simply obturating and freeing, respectively, an aperture provided in the handgrip and communicating with a bypass duct in parallel with the duct that supplies the compressed air to the cylinder-piston assembly.

13 Claims, 7 Drawing Figures

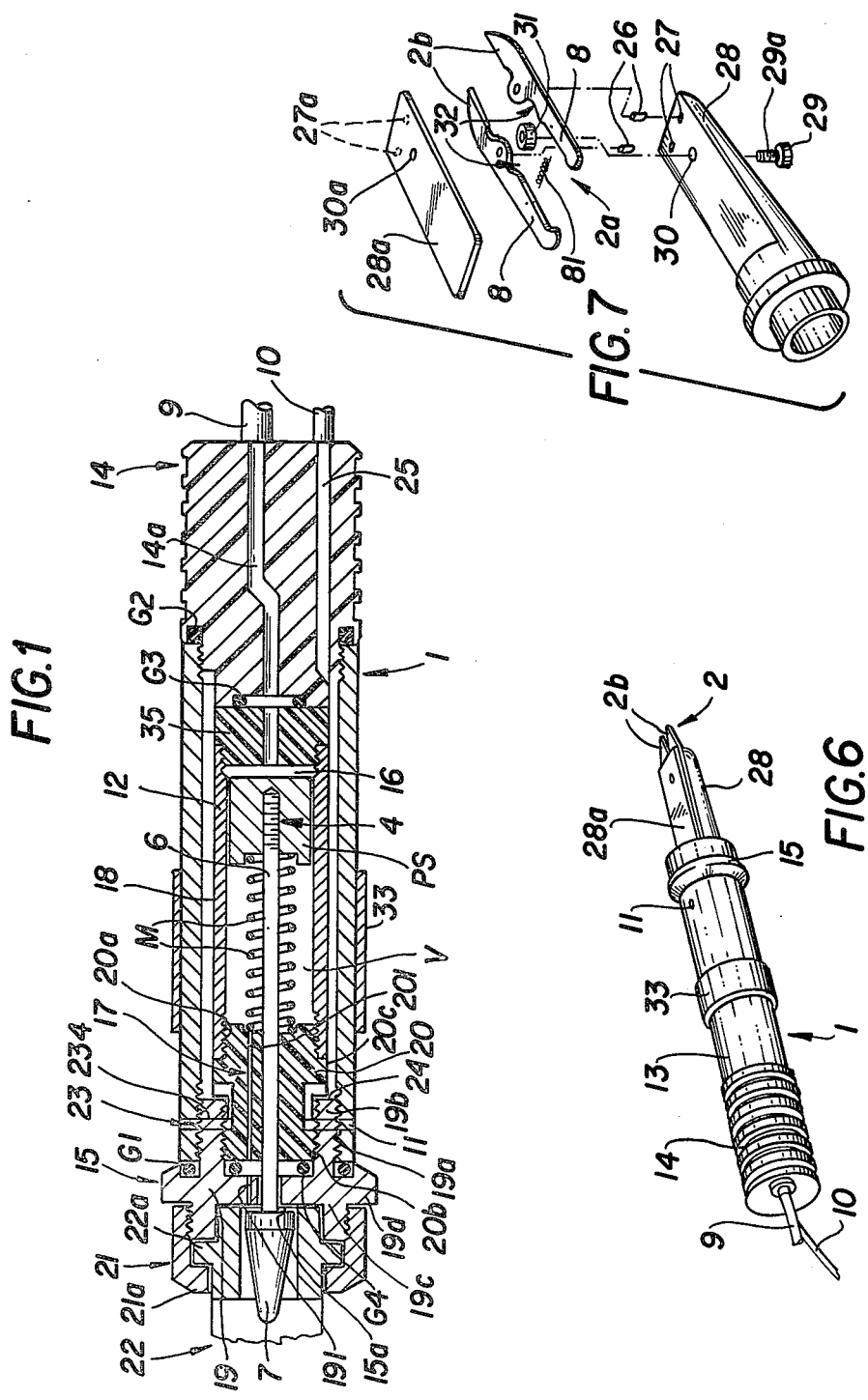

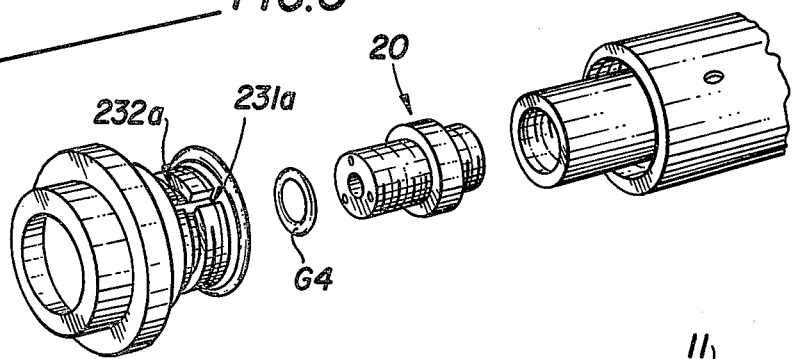
FIG. 3
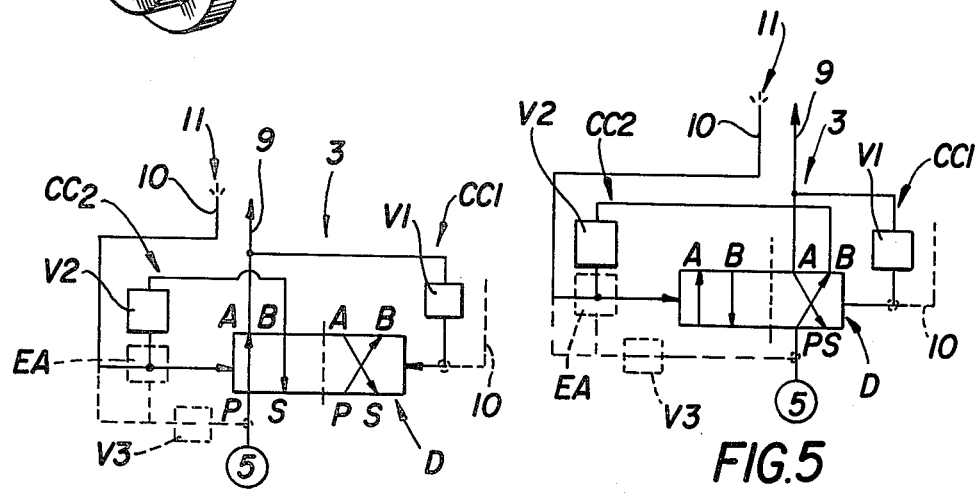
FIG. 4
FIG. 5
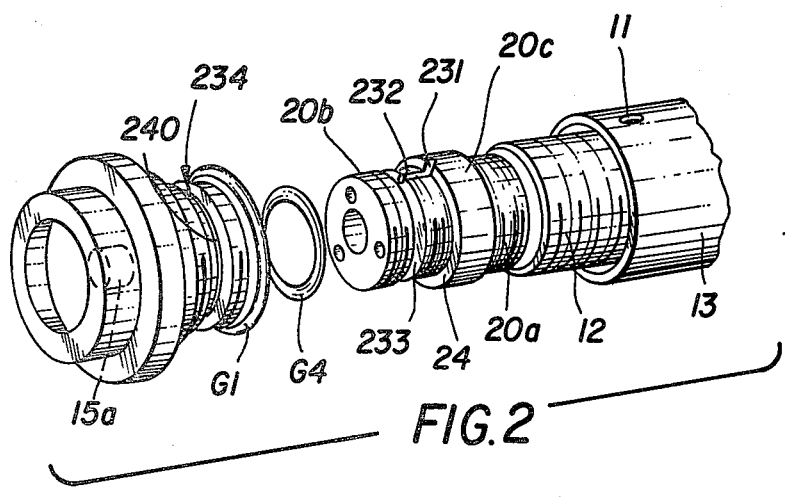
FIG. 2

PNEUMATICALLY ACTUATED AND CONTROLLED DEVICE FOR CARRYING OUT OPERATIONS ON ELECTRONIC COMPONENTS

BACKGROUND OF THE INVENTION

The invention relates to a pneumatically actuated and controlled device for carrying out operations on electronic components.

DESCRIPTION OF THE PRIOR ART

As is known, in the field where operations are carried out on electronic circuits and, in particular, where operations such as cutting, bending and flattening are carried out on the terminals of circuit components, use is made of pneumatic devices in order to render the operations, which are generally repetitive and very numerous, easier and less tiring.

It is customary for the devices to comprise a handgrip inside which is placed a control device for actuating pincers positioned at the front of the handgrip. A control device of this nature essentially comprises a pneumatic cylinder (usually double acting) for controlling the movement, along a path parallel to the longitudinal axis of the cylinder and in two directions, of the rod of the cylinder, at the tip of which a wedge shaped head is provided for causing, in the outgoing direction, the closing of the pincers, and in the incoming direction, the opening of the pincers.

For the pincer closing operation, it is necessary that a lever located in the region of the handgrip be pressed down; with the release of the lever, the immediate re-opening of the pincers is brought about, and so on and so forth.

It is obvious that in this way the cutting and flattening stress, just as that for the closing of the limbs of the pincers, is sustained by the control device in the inside of the handgrip and not by the operator. This naturally makes it possible for a certain number of operations to be performed easily and rapidly in a given unit of time without any adverse effect on the operator.

With the above described devices, however, one rather noticeable difficulty lies in the fact that the aforementioned operations take place under constantly worsening conditions as the sizes of the electronic components decrease; the need arises to keep reducing as much as possible the overall volume of the pneumatic devices utilized. From this aspect, despite the effort to maintain limited overall dimensions, the pneumatic devices mentioned are certainly not optimum, this being because of the presence of the operating lever, because of the dimensions of the pneumatic cylinder in the inside of the handgrip, and because of the dimensions of the other components required for the operation thereof.

Another notable problem with this type of device is that the closing or the opening of the pincers is achieved through the operation of the lever, thereby rendering such pneumatic devices only partially automatic.

SUMMARY OF THE INVENTION

The object of the invention is to create a pneumatically actuated and controlled device with which it is possible to simplify greatly the manual closing (or re-opening) operation of the pincers, or of whatever other tool is used, and with which it is contemporaneously possible to simplify to an extreme and, above all, to reduce notably in volume the device in its entirety, with a consequent visible improvement in the utilization of the device; the foregoing applying in particular to cases in which the device is used for small size components.

Another object of the invention is make it possible for the closing and opening phases of the limbs of which the pincers are composed to be effected, at adjustable intervals, in a repetitive and automatic fashion.

A further object of the invention is to make it possible for the tool-holders to be easily interchangeable and, thereby, to reduce lost time to a minimum when one tool has to be replaced with another.

Yet another object too is to reduce friction to a minimum as the limbs of the tool close and open, with a consequential rock bottom friction loss and reduced sizing of the powering circuit.

These and other objects too are attached with the device forming the subject of the invention that is of the type that comprises a handgrip, at the front of which is placed a tool-holder for pincer type tools having a pair of limbs, there being in the inside of the sand handgrip a cylinder-piston assembly operated by a source of compressed air. The piston has a rod which has at the tip a conical head provided to come into contact with a pair of levers connected to the limbs so as to occasion their closing and their subsequent re-opening with the return to the original position of the conical head. The device is characterized by the fact that, in parallel with the duct that supplies the compressed air to the cylinder-piston assembly, it is provided with a further bypass duct that communicates, in the region of the handgrip of the tool, with an aperture communicating freely with the outside.

The device as described above is, moreover, characterized by the fact that the bypass duct with the said non-obstructed aperture, bypasses a pneumatic circuit for the automatic operation, intermittently at adjustable intervals, of the cylinder-piston assembly to which the source of compressed air is supplied.

BRIEF DESCRIPTION OF THE DRAWINGS

Further characteristics and advantages of the device according to the invention will become more apparent from the detailed description that follows of one preferred embodiment, illustrated purely as an unlimited example on the accompanying drawings, in which:

FIG. 1 illustrates a section of the handgrip of the device in question;

FIG. 2 illustrates, in a perspective view and in exploded form, one detail in FIG. 1;

FIG. 3 illustrates, in a perspective view and in exploded form, a second embodiment for the detail according to FIG. 2;

FIG. 4 illustrates, in a first operating position, the pneumatic circuit for the automatic operation, intermittently at adjustable intervals, of the tool;

FIG. 5 illustrates, in the second operating position, the pneumatic circuit according to FIG. 4;

FIGS. 6 and 7 illustrate, the former in a perspective view and the latter in exploded form, the handgrip and the tool, respectively, belonging to the device in question.

DESCRIPTION OF THE PREFERRED EMBODIMENT

With reference to the above listed drawings, the device forming the subject of the invention comprises a handgrip (1), at the front of which is placed a tool-holder (2) for implements that are normally of the pincer type and are thus provided with a pair of limbs (2b). Housed inside the handgrip (1) there is a cylinder-piston assembly (4) controlled by a source of compressed air (5) (see FIGS. 4 and 5), downstream of which is located a pneumatic circuit (3) for the automatic operation, intermittently at adjustable intervals, of the aforementioned cylinder-piston assembly (4), via a flexible duct (9). The duct commences at the pneumatic circuit (3) and passes into the bottom of the handgrip (1) in communication with a through hole (14a) which, in turn, communicates with the chamber (16) of the cylinder (12) of the cylinder-piston assembly (4). The rod (6) of the cylinder-piston assembly (4) has at the tip a conical head (7) provided to come into contact with a pair of levers (8) integral with the respective limbs (2b), so as to occasion the closing of the limbs (2b) and their subsequent re-opening with the return to the original position of the conical head (7).

The placing in service of the cylinder-piston assembly (4) is always dependent on the obturation or the freeing of an aperture (11) that normally communicates with the outside and is made in the extreme front part of an external tubular element (13) of the handgrip (1). The aperture (11), which can obviously be obturated by, for example, the thumb of the operator, communicates with a bypass duct (10), in parallel with the duct (9) that supplies the compressed air to the cylinder-piston assembly (4).

Before going into details concerning the conformation of the handgrip (1) and of the internal parts thereof, a description will be given of the pneumatic circuit (3) which, in the embodiment depicted in FIGS. 4 and 5, is essentially constituted by a four way distributor (D) that has slide movement operation on both sides, two outlet positions (A) and (B), a vent (S) and an inlet (P) to which the compressed air coming from the source (5) is sent.

The outlet (A), which in practice coincides with the duct (9) is, therefore, placed in communication with the cylinder (12) of the cylinder-piston assembly (4), and it is provided with a pneumatic line (CC1) equipped with a throttle valve (V1) whose outflow port has an adjustable setting and from the outlet of which the right to left translation of the slide of the distributor (D) is controlled. The outlet (B) of the distributor (D) is provided with a second pneumatic line (CC2) that is also equipped with a throttle valve (V2) and from the outlet of which the left to right translation of the slide is controlled.

In a first operating position, namely with the valve (V2) having previously displaced the slide from left to right (see FIG. 4), the outlet (A) of the distributor (D) is in direct communication with the source of compressed air (5), while the outlet (B) is paired with the vent (S) and the valve (V1) is exerting, since it is bypassed with the duct (9) that at this moment is supplying compressed air, a thrust on the slide of the distributor (D). Meanwhile the source (5) is supplying, provided the aperture (11) has been obturated, the impulse required by the cylinder-piston assembly (4) to cause the rod (6) thereof to project and to close the limbs (2b) of the tool. Once the valve (V1) has displaced the slide from right to left, the operational diagram becomes that shown in FIG. 5, in which the duct (9) is this time, via the outlet (A), paired with the vent (S) in such a way that the cylinder-piston assembly (4) can go back to the initial non-operative position, this being on account of the pressure that the spring (M) exerts on the piston (PS) positioned in the inside of the cylinder (12). Vice versa, the outlet (B) is in direct communication with the source (5) and is thus exercising a certain pressure on the left of the slide of the distributor (D) so that the conditions seen previously in FIG. 4 may be resumed, that is to say, the condition in which the limbs (2b) are closed.

The valves (V1) and (V2) make it possible for the closing and opening frequency of the limbs to be regulated; this applies particularly to the limb closing time (valve V1) and to the limb opening time (valve V2). It should be noted in FIGS. 4 and 5 that the duct (10) has been bypassed directly downstream of the valve (V2) and carried onto the handgrip (1) (see FIG. 2). In this way the duct (10) bypasses the pneumatic circuit (3), that is to say, when the aperture (11) is not obstructed it is as if the pneumatic circuit (3) were not exercising any control over the cylinder-piston assembly (4). Note should, however, be taken of the fact that the bypassing can be achieved in other ways without there being noticeable operating variations with respect to the preceding case.

For example, it is possible to effect a bypass of the preceding type wherein the flow can also be adjusted, through a bypass taken downstream of the valve (V1) (see FIGS. 4 and 5).

Furthermore, it should also be noted that more sensitive operation and faster response can be had when, for example, the valve (V2) instead of directly operating the slide, does so via an AND element (EA), the output of which controls the slide and the other input of which is supplied directly by the source (5) with the interposition of a third throttle valve (V3) for limiting the flow on the aperture (11). The said AND element (EA) supplies an operating output when and only when pressure is present contemporaneously at the inputs thereof.

This having been stated, a detailed description will now be given of the handgrip (1), the major part of which is, as specified earlier on, constituted by the external tubular element (13). The extremities of the element (13) engage hermetically with a first and a second sealing member, (14) and (15), respectively, the former having inside it a through hole (14a) and the latter a through hole (15a). The function of the first through hole (14a) has already been stated; on one side it is placed in communication with the duct (9), and on the other, with the chamber (16) of the cylinder (12). The second hole (15a) allows the passage of the rod (6) belonging to the cylinder-piston assembly (4), which projects from a third sealing member (17) of the cylinder (12). The sealing member (17) engages hermetically with the second sealing member (15) and supports the cylinder (12) in a coaxial position slightly away from the tubular element (13). Thus between the latter and the cylinder (12) there is at (18) a hollow space that meets the aperture (11), through an outlet path (23) more about which will be said below.

The said hollow space (18) is placed in communication with the bypass duct (10); in FIG. 1 the duct (10) is placed in communication with the hollow space (18) via a through hole (25) machined in the sealing member (14): in this configuration it is possible to bypass the duct (10) immediately downstream of the source of compressed air (5) (with the interposition of the valve V3), or downstream of the valve (V1), or downstream of the valve (V2).

Reverting now to the mechanical coupling parts of the handgrip (1), it is necessary to specify that the second and third sealing members (15) and (17) are in reality constituted, respectively, by the nipples (19) and (20).

On the tool-holder (2) side, the nipple (19) engages externally with a ring nut (21) on which there is an internal circular part (21a) that abuts with a circumferential projection (22a) on the extremity (22) of the tool-holder (2). In this way, the part (21a) keeps the circumferential projection (22a) flush up against the outer edge of the nipple (19) so that although the tool-holder (2) remains rigidly coupled to the handgrip (1), it can easily be detached there from.

This type of coupling makes it possible for the tool-holder (2) to be oriented in any position with respect to the aperture (11). In fact, before tightening the ring nut (21) fully, the tool-holder should be oriented as required and then this position should be rendered stable by locking the ring nut. It thus follows that the operator is able to grip the tool in the manner and way most suited to the specific case.

The nipped (19) which is provided internally with a circular sector (19c) in the center of which the through hole (15a) is machined, engages on the opposite side, by means of an external thread (19a), with the tubular element (13), and by means of an internal thread (19b) with the thread (20b) of the nipple (20). The other thread (20a) of the nipple (20) engages, instead, with the cylinder (12). It should also be noted that the nipple (19) is provided with an external circular rib (19d) against which a sealing action is exerted by a gasket (G1) onto which abuts the front extremity of the tubular element (13). The latter is further sealed by a similar gasket (G2) placed on the sealing member (14).

The maximum gauge of the cylinder part of the nipple (20) is preforce of a lesser diameter than the inside diameter of the tubular element (13), in order to permit there to be a communication, through the previously mentioned outlet path (23), between the hollow space (18) and the aperture (11).

How the said path (23) is achieved in practice can clearly be seen in FIG. 2. The said path is defined by a first groove (231) perpendicular to the axis of the nipple (20) and machined therein at a point corresponding to the vertical wall (24) in contact with the nipple (19). The groove (231) joins with a second longitudinal groove (232) machined in the nipple (20) in the region of the thread (20b) thereof, and this in turn communicates with a third annular groove (233) machined circumferentially in the same part of the nipple (20). The groove (233) communicates, in turn, with a number of through holes (240) made radially in the cylindrical wall of the nipple (19) that is superposed over the nipple (20). The cylindrical wall is provided externally with a fourth annular groove (234) that is machined circumferentially in the thread (19a) and communicates with the through holes (240) and ultimately with the aperture (11).

An alternative solution for the constitution of the path (23) is given clearly in FIG. 3.

In this particular instance the path (23) is defined by a first longitudinal groove (231a) machined along the thread (19a) of the nipple (19) and communicating, on one side, with the hollow space (18) directly, and on the other, with a second annular groove (232a) machined in the thread (19a) and, in turn, communicating with the aperture (11).

It is necessary at this juncture to point out that with the invention in question it is extremely important that the points where the compressed air is present be sealed perfectly. In this connection mention has previously been made of the gaskets (G1) and (G2) fitted to isolate, obviously at the time when the aperture (11) is maintained obturated, the hollow space (18) from the outside atmosphere. However, other gaskets are needed, namely a gasket (G3) to seal the compressed air in the duct (9), interposed between the sealing member (14) and the sealing plug (35), and a further gasket (G4) interposed between the sector (19c) of the nipple (19) and the front wall (20d) of the nipple (20). In the inside of the compartment (V) in which the spring (M) for the return of the piston (PS) is housed, the air present is able to escape towards the outside via through holes (201) and (191) machined longitudinally along the nipple (20) and the nipple (19), respectively.

The sealing gasket (G4) is provided to prevent the "control" air present in the hollow space (18) from escaping through the holes (201) and (191).

It must be stressed that the dimensions of the cylinder-piston assembly (4) are normally lesser than those needed in other cases, also because of the fact that with the tool (2) used in the invention in question, friction during the pivoting of the limbs (2b) is reduced to tiny proportions. In the embodiment shown in FIG. 7, each of the limbs (2b) has a pivot fulcrum constituted by a pin (26), the extremities of which are inserted in corresponding blind holes (27) and (27a), machined in the support plates (28) and (28a), respectively. The limbs (2b) are situated in between the plates, and the latter are secured one to the other by means of a screw (29) that is inserted through the hole (30) in the plate (28) and engages in a corresponding threaded hole (30a) made in the plate (28a) in a position downstream of the blind holes (27) and (27a) between the levers (8). The levers (8) are made in one piece with the limbs (2b) and are fastened one to the other by means (81) of an elastic nature. The shank (29a) of the screw passes freely in the inside of an annular element (31) that is interposed between the levers (8), in the region of the recesses (32). The gauge of the annular element (31) is greater than that of the limbs (2b), and in this way the locking one to the other of the plates (28) and (28a) does not impede the free pivoting of the limbs (2b). Above all, the pins (26) around which the limbs (2b) pivot are protected completely since they are situated in blind holes, and thus the danger that they could be reached by substances that would limit the free pivoting of the limbs (2b), is overcome.

Furthermore, the way in which the tool is constructed is such that it is extremely flat and limited in size, this making it possible to reach even points in small spaces.

To conclude, the fact is stressed that the aperture (11) can also be obturated by an annular element (33) that slides, though not in a free running fashion, longitudinally along the tubular element, so that the operator can, if it is wished to operate automatically, handle the device in whatever way is wished, without being obliged to keep, for example, the thumb over the aperture (11).

What is claimed is:

1. A device for carrying out operations on electronic components, comprising a handgrip, a tool-holder mounted on said handgrip, said tool-holder being adapted for holding pincer type tools having a pair of limbs, a cylinder-piston assembly mounted in said handgrip and operated by a source of compressed air, a rod mounted in said handgrip and operatively associated with said assembly and having a conical head provided to come into contact with a pair of levers connected to said limbs so as to occasion their closing and their subsequent re-opening with the return to the original position of said conical head, said device being characterized by the fact that, in parallel with the supply of compressed air to said cylinder-piston assembly, it is provided with a bypass duct that communicates, in the region of the handgrip of the tool, with an aperture communicating freely with the outside, said limbs being alternately closed and opened when said aperture is obstructed.

2. Device according to claim 1 wherein said bypass duct bypasses a pneumatic circuit for the automatic operation, intermittently at adjustable intervals, of said cylinder-piston assembly to which said source of compressed air is supplied.

3. Device according to claim 2 wherein the said pneumatic circuit comprises:
   a four way distributor that has slide movement operation on both sides, two outlet positions, a vent and an inlet to which the compressed air coming from the source of compressed air is sent;
   a first pneumatic line for controlling the movement of said distributor, that communicates with said source of compressed air, via a first of two outlets, when said distributor is displaced, the outlet in question then being placed in direct communication with the cylinder of the cylinder-piston assembly;
   a second pneumatic line for controlling the movement of said distributor, that communicates with said source of compressed air, via the second of said two outlets, when said distributor is displaced, thus placing said cylinder in communication with said vent.

4. Device according to claim 3 comprising a plurality of pneumatic circuits wherein for each of said pneumatic circuits there is a throttle valve having an outflow port with an adjustable setting.

5. Device according to claim 4 comprising an AND element having two inputs and producing an output, wherein the movement of the slide of the said distributor is controlled, on at least one side, by pressurized air coming from the output of said AND element, said output being present when pressurized air is present at both inputs of said AND element, the first of said inputs being connected to the output of a second throttle valve, and the other input being connected to said source of compressed air, with the interposition of a third throttle valve.

6. Device according to claim 1 or 2 wherein said handgrip is constituted by an external tubular element having a front and a rear, the extremities of which engage hermetically with a first and second sealing member inside each of which there is a through hole, one of said holes being placed in communication, on one side, with the source of compressed air, and on the other side, with said assembly, and the other of said holes allowing the passage of the rod belonging to said cylinder-piston assembly, said rod projecting from a third sealing member for said cylinder, that engages hermetically with said second sealing member and supports said cylinder in a coaxial position slightly away from said tubular element, in such a way as to provide a hollow space that meets said aperture and is fashioned in the front of said tubular element.

7. Device according to claim 6 wherein said second and third sealing members are constituted by first and second nipples each having two threads, characterized by the fact that the first nipple engages externally with a ring nut which maintains the tool-holder, where a circumferential projection is provided, flush up against the outer edge of said nipple, keeping the tool-holder rigidly coupled to the handgrip, said nipple engaging said tubular element, via an external thread and, moreover engaging, via an internal thread, with one thread on the second nipple, the other thread thereof engaging with the cylinder, the maximum gauge of the latter mentioned nipple being of a lesser diameter than the inside diameter of the tubular element.

8. Device according to claim 7 wherein between the two nipples a path has been machined for the discharge of the air present in said hollow space, towards said aperture located above the thread on the outside of the first of the two nipples.

9. Device according to claim 8 wherein said path is defined by a first groove perpendicular to the axis of the second of the two nipples and machined therein in the region in contact with the first of said two nipples, said first groove joining a second longitudinal groove, parallel to the axis of the second of said two nipples and machined therein in the region of the thread thereon, said second groove communicating with a third annular groove that is machined circumferentially on the second nipple and communicates with a number of through holes made radially in the cylindrical wall of the first nipple, said cylindrical wall having externally a fourth annular groove, machined circumferentially in the thread of said first nipple, this communicating with said through holes as well as with said aperture.

10. Device according to claim 8 wherein said path is defined by a first longitudinal groove machined along the external thread of the first of the two nipples and communicating, on one side, with the hollow space, and on the other, with a second annular groove machined in the external thread of the first of the two nipples and, in turn, communicating with said aperture.

11. Device according to claim 6 wherein said hollow space is placed in communication with said bypass duct, via a through hole made in the first sealing member, said bypass duct, in turn, communicating with the source of compressed air, with the interposition of a throttle valve.

12. Device according to claim 1 wherein said limbs have at least one first fulcrum constituted by a pin having two extremities, said extremities being inserted in corresponding blind holes respectively machined in two opposite support plates, in between which said limbs are situated, said plates being secured one to the other by means of a screw inserted in a hole in one of the two plates that engages with a threaded hole in the other plate, in a position downstream of said blind holes and between said levers, the latter being attracted one to the other by elastic means, said screw having a shank passing freely inside an annular element, interposed between said levers and of a gauge greater than that of said limbs.

13. Device according to claim 6 further comprising an annular element mounted for longitudinally sliding movement along the tubular element for selectively blocking and unblocking said aperture.

* * * * *